(12) United States Patent
Moon et al.

(10) Patent No.: US 9,754,723 B2
(45) Date of Patent: Sep. 5, 2017

(54) COMPOSITE ELECTRONIC COMPONENT AND BOARD FOR MOUNTING THEREOF

(71) Applicant: SAMSUNG ELECTRO-MECHANICS CO., LTD., Suwon-Si, Gyeonggi-Do (KR)

(72) Inventors: Byeong Cheol Moon, Suwon-Si (KR); Jae Hoon Lee, Suwon-Si (KR); Myeong Gi Kim, Suwon-Si (KR); Jin Woo Han, Suwon-Si (KR); Soo Hwan Son, Suwon-Si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 208 days.

(21) Appl. No.: 14/485,437

(22) Filed: Sep. 12, 2014

(65) Prior Publication Data

US 2015/0371780 A1 Dec. 24, 2015

(30) Foreign Application Priority Data

Jun. 24, 2014 (KR) ........................ 10-2014-0077159

(51) Int. Cl.
| | |
|---|---|
| *H05K 7/10* | (2006.01) |
| *H05K 7/12* | (2006.01) |
| *H01G 4/40* | (2006.01) |
| *H01G 4/30* | (2006.01) |

(Continued)

(52) U.S. Cl.
CPC .............. *H01G 4/40* (2013.01); *H01F 27/022* (2013.01); *H01F 27/292* (2013.01); *H01F 27/40* (2013.01);

(Continued)

(58) Field of Classification Search
CPC ........ H01F 2027/2809; H01F 27/2804; H01G 4/30; H01G 4/40; H05K 1/0231;

(Continued)

(56) References Cited

U.S. PATENT DOCUMENTS

| | | | | |
|---|---|---|---|---|
| 4,821,005 A | * | 4/1989 | Kling | H05K 1/0231 333/12 |
| 5,602,517 A | * | 2/1997 | Kaneko | H03H 7/0115 333/185 |

(Continued)

FOREIGN PATENT DOCUMENTS

| | | |
|---|---|---|
| JP | 11-087793 A | 3/1999 |
| JP | 2001-176728 A | 6/2001 |
| KR | 2003-0014586 A | 2/2003 |

*Primary Examiner* — Yuriy Semenenko
(74) *Attorney, Agent, or Firm* — McDermott Will & Emery LLP

(57) ABSTRACT

A composite electronic component may include a composite body including a capacitor and an inductor coupled to each other; an input terminal formed on a first end surface of the composite body and connected to the coil part of the inductor; an output terminal including a first output terminal formed on a second end surface of the composite body and connected to the coil part of the inductor and a second output terminal formed on the second end surface of the composite body and connected to the first internal electrode of the capacitor; and a ground terminal formed on a first end surface of the capacitor in the composite body. The capacitor may be coupled to a side surface of the inductor, and the sum of ratio of lengths of a short axis to a long axis of the coil part is 0.7 to 1.0.

15 Claims, 11 Drawing Sheets

(51) Int. Cl.
*H05K 1/18* (2006.01)
*H01F 27/02* (2006.01)
*H01F 27/29* (2006.01)
*H01F 27/40* (2006.01)
*H01F 27/28* (2006.01)
*H05K 1/02* (2006.01)

(52) U.S. Cl.
CPC ............... *H01G 4/30* (2013.01); *H05K 1/181* (2013.01); *H01F 2027/2809* (2013.01); *H05K 1/0231* (2013.01); *H05K 1/0233* (2013.01); *H05K 2201/1003* (2013.01); *H05K 2201/10015* (2013.01); *Y02P 70/611* (2015.11)

(58) Field of Classification Search
CPC ................. H05K 1/0233; H05K 1/181; H05K 2201/10015; H05K 2201/1003
See application file for complete search history.

(56) References Cited

U.S. PATENT DOCUMENTS

| | | | |
|---|---|---|---|
| 6,448,873 B1* | 9/2002 | Mostov .............. | H01F 17/0006 333/184 |
| 2003/0030510 A1 | 2/2003 | Sasaki et al. | |
| 2007/0121275 A1* | 5/2007 | Takashima ............ | H01G 4/385 361/311 |
| 2014/0211439 A1* | 7/2014 | Gerber .................... | H05K 7/02 361/767 |
| 2015/0213960 A1* | 7/2015 | Moon ..................... | H01G 4/40 361/270 |
| 2015/0340153 A1* | 11/2015 | Lohr .................. | H01F 27/2804 336/200 |
| 2016/0014886 A1* | 1/2016 | Kim ........................ | H01G 4/40 361/767 |

* cited by examiner

COMPOSITE ELECTRONIC COMPONENT AND BOARD FOR MOUNTING THEREOF

CROSS-REFERENCE TO RELATED APPLICATION

This application claims the benefit of Korean Patent Application No. 10-2014-0077159 filed on Jun. 24, 2014, with the Korean Intellectual Property Office, the disclosure of which is incorporated herein by reference.

BACKGROUND

The present disclosure relates to a composite electronic component including a plurality of passive elements and a board for mounting thereof.

In accordance with the recent trend toward slimness and lightness and high performance in electronic devices, miniaturization and multifunction of the electronic devices have been required.

Such an electronic device includes a power semiconductor-based power management integrated circuit (PMIC) serving to efficiently control and manage a limited battery resource in order to satisfy various service requirements.

However, as the electronic device has various functions, the number of direct current (DC) to DC converters included in the PMIC has been increased, and the number of passive elements that should be included in a power input terminal and a power output terminal of the PMIC has also been increased.

In this case, since a component arrangement area of the electronic device is required to increase, there is a limitation in miniaturizing an electronic device.

In addition, high noise may occur due to wiring patterns of the PMIC and peripheral circuits of the PMIC.

In order to solve the above-mentioned problems, research into a composite electronic component in which an inductor and a capacitor are vertically coupled to each other has been conducted, such that an effect of decreasing a component arrangement area of the electronic device and suppressing the occurrence of noise may be obtained.

However, in the case of vertically disposing the inductor and the capacitor, a magnetic flux generated in the inductor may affect internal electrodes of the capacitor to generate parasitic capacitance, such that a self resonant frequency (SRF) may move toward a low frequency.

Meanwhile, as the composite electronic component has been miniaturized, and thus, an internal magnetic layer blocking a magnetic field of the inductor has also been reduced, a problem in which Q factor may be deteriorated is present.

RELATED ART DOCUMENT

Korean Patent Laid-Open Publication No. 2003-0014586

SUMMARY

An in exemplary embodiment in the present disclosure may provide a composite electronic component capable of decreasing a component mounting area in a driving power supply system, and a board for mounting thereof.

An exemplary embodiment in the present disclosure may also provide a composite electronic component capable of suppressing noise from occurring in a driving power supply system, and a board for mounting thereof.

According to some embodiments in the present disclosure, a composite electronic component may include: a composite body including a capacitor and an inductor coupled to each other, the capacitor being configured of a ceramic body including a plurality of dielectric layers and first and second internal electrodes disposed to face each other with a respective dielectric layer interposed between the first and second internal electrodes are stacked, and the inductor being configured of a magnetic body including a coil part; an input terminal formed on a first end surface of the composite body and connected to the coil part of the inductor; an output terminal including a first output terminal formed on a second end surface of the composite body and connected to the coil part of the inductor and a second output terminal formed on the second end surface of the composite body and connected to the first internal electrode of the capacitor; and a ground terminal formed on one or more of upper and lower surfaces and a first end surface of the capacitor in the composite body and connected to the second internal electrode of the capacitor. The capacitor may be coupled to a side surface of the inductor, and the sum of the ratio of lengths of a short axis to a long axis of the coil part may be 0.7 to 1.0.

The magnetic body may have a form in which a plurality of magnetic layers including a conductive pattern formed on the magnetic layers are stacked, and the conductive pattern may configure the coil part.

The inductor may have a form of a thin film in which the magnetic body includes an insulation substrate and a coil formed on at least one surface of the insulation substrate.

The magnetic body may have a form in which the magnetic body includes a core and a winding coil wound around the core.

The inductor may be a power inductor.

The capacitor and the inductor may be connected to each other by a conductive adhesive.

According to some embodiments in the present disclosure, a composite electronic component may include: an input terminal receiving power converted by a power management unit; a power stabilization unit stabilizing the power and including a composite body including a capacitor and an inductor coupled to each other, the capacitor being configured of a ceramic body in which a plurality of dielectric layers and first and second internal electrodes disposed to face each other with a respective dielectric layer interposed between the first and second internal electrodes are stacked, the inductor being configured of a magnetic body including a coil part, the capacitor being coupled to a side surface of the inductor, and the sum of the ratio of lengths of a short axis to a long axis of the coil part being 0.7 to 1.0; an output terminal supplying the stabilized power; and a ground terminal for grounding.

The input terminal may be formed on a first end surface of the composite body, the output terminal may include a first output terminal formed on a second end surface of the composite body and connected to the coil part of the inductor and a second output terminal formed on the second end surface of the composite body and connected to the first internal electrode of the capacitor, and the ground terminal may be formed on one or more of upper and lower surfaces and a first end surface of the capacitor in the composite body and connected to the second internal electrode of the capacitor.

The magnetic body may have a form in which a plurality of magnetic layers including a conductive pattern formed on the magnetic layers are stacked, and the conductive pattern may configure the coil part.

The inductor may have a form of a thin film in which the magnetic body includes an insulation substrate and a coil formed on at least one surface of the insulation substrate.

The magnetic body may have a form including a core and a winding coil wound around the core.

The inductor may be a power inductor.

The capacitor and the inductor may be connected to each other by a conductive adhesive.

According to some embodiments in the present disclosure, a board for mounting of a composite electronic component may include: a printed circuit board having three or more electrode pads formed on the printed circuit board; the composite electronic component as described above, mounted on the printed circuit board; and a soldering connecting the electrode pads and the composite electronic component.

BRIEF DESCRIPTION OF DRAWINGS

The above and other aspects, features and other advantages in the present disclosure will be more clearly understood from the following detailed description taken in conjunction with the accompanying drawings, in which.

DETAILED DESCRIPTION

Figure 1:
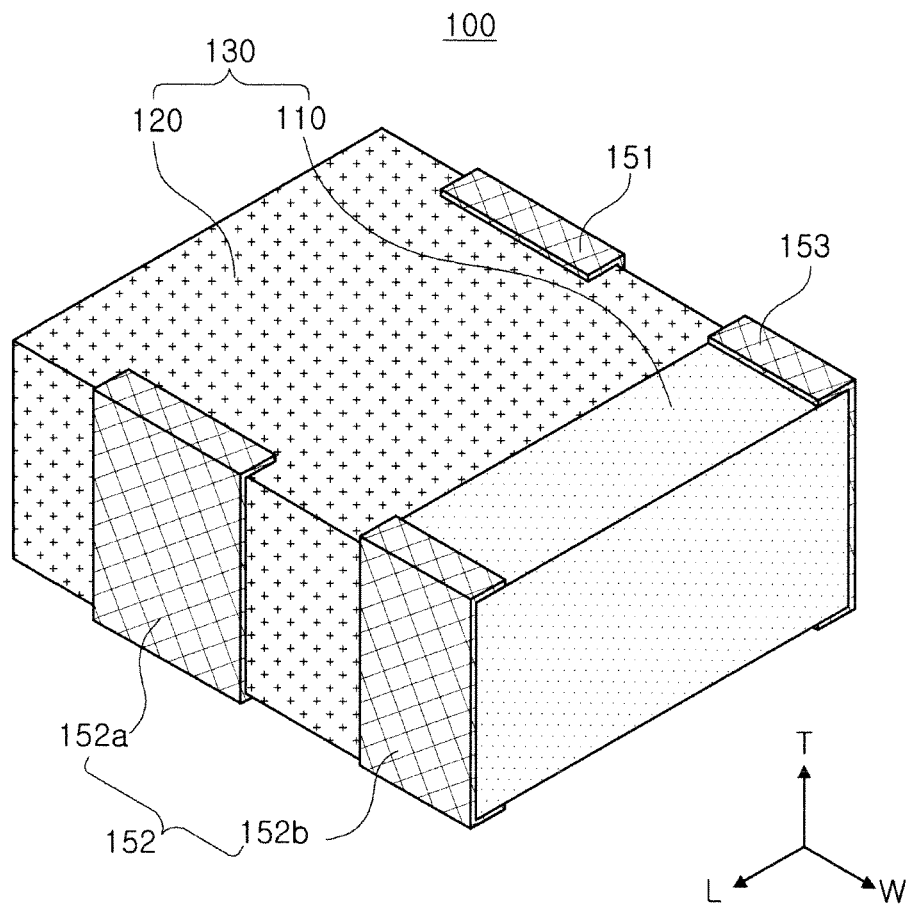
FIG. 1 is a perspective diagram schematically illustrating a composite electronic component according to an embodiment in the present disclosure.

Exemplary embodiments in the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Composite Electronic Component

FIG. 1 is a perspective diagram schematically illustrating a composite electronic component according to an embodiment in the present disclosure.

Figure 2:
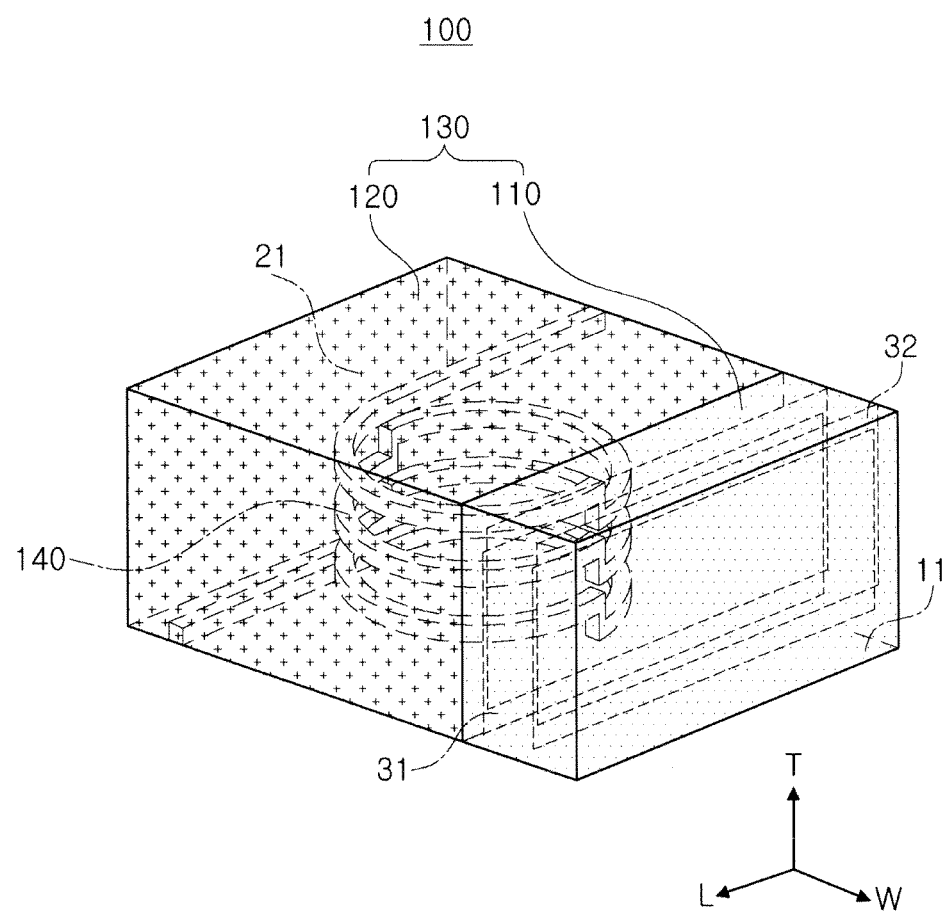
FIG. 2 is a schematic perspective diagram illustrating an interior of a composite electronic component according to a first exemplary embodiment in the present disclosure, in components of FIG. 1.

FIG. 2 is a schematic perspective diagram illustrating an interior of a composite electronic component according to a first exemplary embodiment in the present disclosure, in components of FIG. 1.

Figure 3:
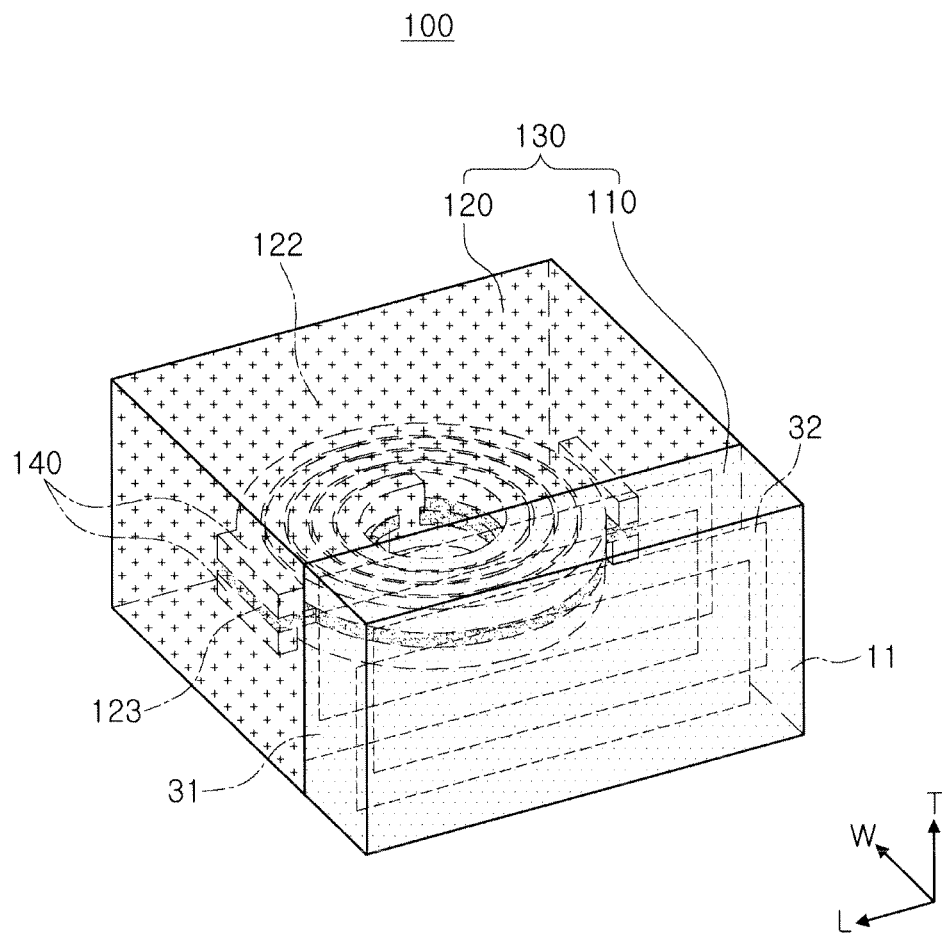
FIG. 3 is a schematic perspective diagram illustrating an interior of a composite electronic component according to a second exemplary embodiment in the present disclosure, in components of FIG. 1.

FIG. 3 is a schematic perspective diagram illustrating an interior of a composite electronic component according to a second exemplary embodiment in the present disclosure, in components of FIG. 1.

Figure 4:
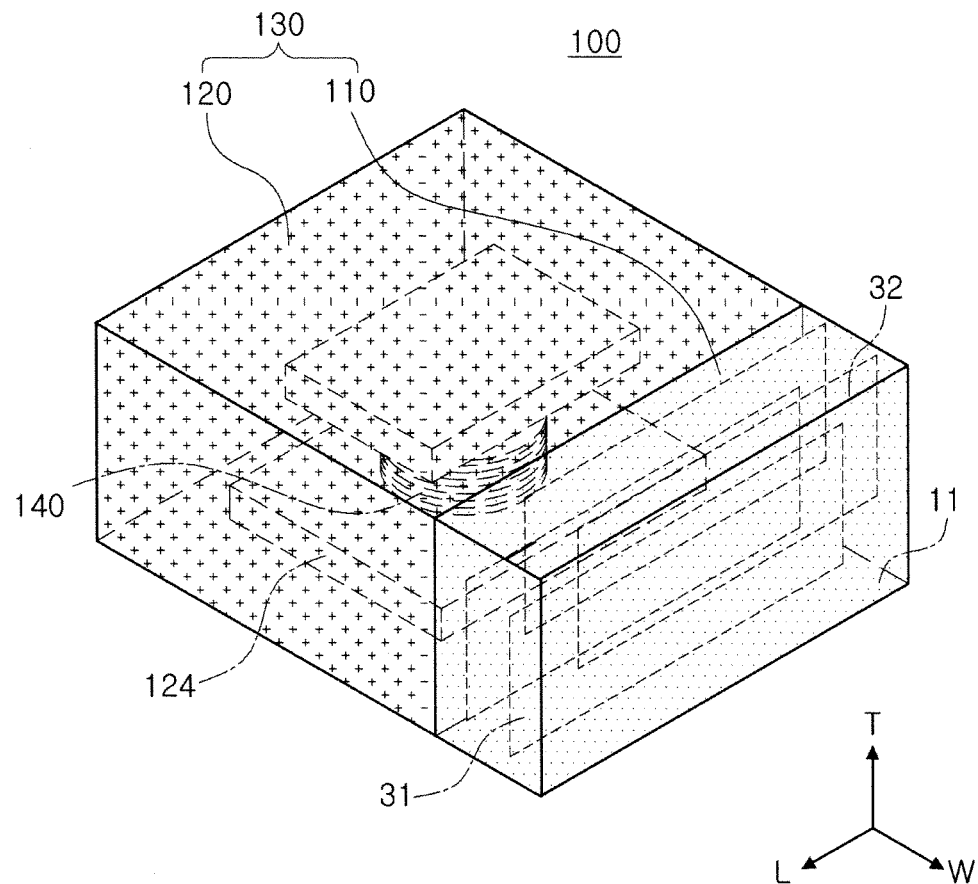
FIG. 4 is a schematic perspective diagram illustrating an interior of a composite electronic component according to a third exemplary embodiment in the present disclosure, in components of FIG. 1.

FIG. 4 is a schematic perspective diagram illustrating an interior of a composite electronic component according to a third exemplary embodiment in the present disclosure, in components of FIG. 1.

Figure 5:
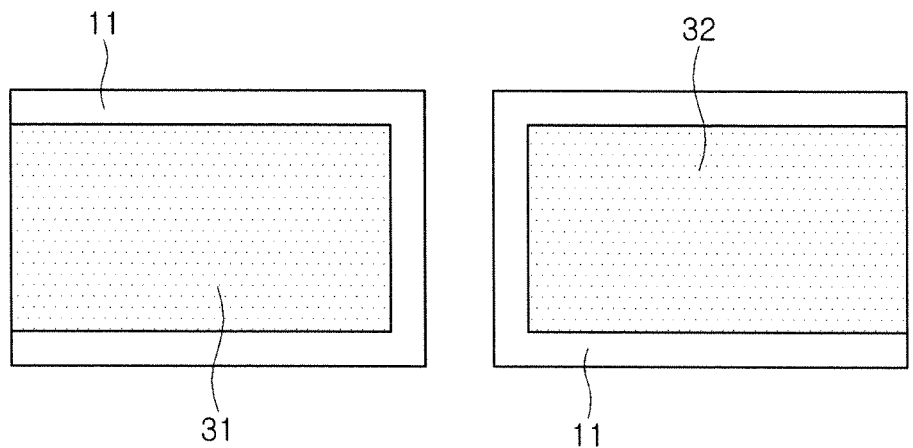
FIG. 5 is a plan diagram illustrating an internal electrode applicable to a multilayer ceramic capacitor of the composite electronic component shown in FIG. 1.

FIG. 5 is a plan diagram illustrating an internal electrode applicable to a multilayer ceramic capacitor of the composite electronic component shown in FIG. 1.

Referring to FIG. 1, in the composite electronic component according to an exemplary embodiment in the present disclosure, a 'length direction' refers to an 'L' direction of FIG. 1, a 'width direction' refers to a 'W' direction of FIG. 1, and a 'thickness direction' refers to a 'T' direction of FIG. 1. Here, the 'thickness direction' may be the same as a direction in which dielectric layers of the capacitor are stacked, for example, a 'stacking direction'.

Meanwhile, the length, width, and thickness directions of the composite electronic component may be the same as length, width, and thickness directions of a capacitor and an inductor, respectively, as described below.

In addition, in the present exemplary embodiment, the composite electronic component may have upper and lower surfaces opposing each other, first and second side surfaces and first and second end surfaces that connect the upper and lower surfaces to each other. A shape of the composite electronic component is not particularly limited, but may be a hexahedral shape as shown.

Further, the first and second side surfaces and the first and second end surfaces of the composite electronic component may be defined as surfaces in the same directions as directions of first and second side surfaces and first and second end surfaces of the capacitor and the inductor, respectively, as described below.

Meanwhile, the composite electronic component has a form in which the capacitor and inductor are coupled to each other, and in the case in which the capacitor is coupled to the side surface of the inductor, the upper surface of the composite electronic component may be defined as upper surfaces of the inductor and the capacitor, and the lower surface of the composite electronic component may be defined as lower surfaces of the inductor and the capacitor.

Further, the first and second side surfaces may correspond to surfaces opposing each other in the width direction of the composite electronic component, the first and second end surfaces may correspond to surfaces opposing each other in the length direction of the composite electronic component, and the upper and lower surfaces may correspond to surfaces opposing each other in the thickness direction of the composite electronic component.

Referring to FIGS. 1 through 3, the composite electronic component 100 according to an embodiment in the present disclosure may include a composite body 130 including a capacitor 110 and an inductor 120 coupled to each other, and the capacitor is configured of a ceramic body in which a plurality of dielectric layers 11 and first and second internal electrodes 31 and 32 disposed to face each other with each of the dielectric layers 11 interposed therebetween are stacked, and the inductor 120 is configured of a magnetic body including a coil part 140.

In the exemplary embodiment in the present disclosure, the composite body 130 may have upper and lower surfaces opposing each other, first and second side surfaces and first and second end surfaces that connect the upper and lower surfaces to each other.

A shape of the composite body 130 is not particularly limited, but may be a hexahedral shape as shown.

The composite body 130 may be formed by coupling the capacitor 110 and the inductor 120, and a method of forming the composite body 130 is not particularly limited.

For example, the composite body 130 may be formed by coupling the capacitor 110 and the inductor 120 that are separately manufactured, using a conductive adhesive, a resin, or the like, but is not particularly limited thereto.

In detail, the adhesive or resin used to couple the capacitor 110 and the inductor 120 to each other may be, for example, an epoxy resin, but is not limited thereto.

A method of coupling the capacitor 110 and the inductor 120 to each other using the conductive adhesive, the resin, or the like, is not particularly limited. For example, the capacitor 110 and the inductor 120 may be coupled to each other by applying a conductive adhesive, a resin, or the like to a coupling surface of the capacitor 110 or the inductor 120 to then be heated and cured.

Meanwhile, according to an exemplary embodiment in the present disclosure, the capacitor 110 may be coupled to the side surface of the inductor 120, but is not limited thereto. For example, the capacitor may be variously disposed.

Hereinafter, the capacitor 110 and the inductor 120 configuring the composite body 130 will be described in detail.

According to an embodiment in the present disclosure, the magnetic body configuring the inductor 120 may include the coil part 140.

The inductor 120 is not particularly limited. For example, the inductor 120 may be a multilayer inductor, a thin film inductor, or a winding inductor.

The multilayer inductor indicates an inductor manufactured by printing an electrode on a thin ferrite or glass ceramic sheet using a thick-film printing method, stacking a plurality of sheets including a coil pattern printed thereon, and connecting internal conducting wires to each other through a via hole.

The thin film inductor indicates an inductor manufactured by forming a coil conducting wire on a ceramic substrate through a thin-film sputtering method or a plating method and filling a ferrite material.

The winding inductor refers to an inductor manufactured by winding a wire (coil conducting wire) around a core.

Referring to FIG. 2, in the case of the composite electronic component according to a first exemplary embodiment in the present disclosure, the inductor 120 may be a multilayer inductor.

In detail, the magnetic body is in a state in which a plurality of magnetic layers 21 including a conductive pattern 41 formed thereon are stacked, and the conductive pattern 41 may configure the coil part 140.

Referring to FIG. 3, in the composite electronic component according to a second exemplary embodiment in the present disclosure, the inductor 120 may be a thin film inductor.

In detail, the inductor 120 may have a thin film shape in which the magnetic body includes an insulation substrate 123 and a coil formed on at least one surface of the insulation substrate 123.

The magnetic body may be formed by filling upper and lower portions of the insulation substrate 123 of which at least one surface is provided with the coil formed thereon, with a magnetic material 122.

Referring to FIG. 4, in the composite electronic component according to a third exemplary embodiment in the present disclosure, the inductor 120 may be a winding inductor.

In further detail, in the case of the inductor 120, the magnetic body thereof may include a core 124 and a winding coil wound around the core 124.

Referring to FIGS. 2 through 4, the first and second internal electrodes 31 and 32 of the capacitor 110 are stacked in a direction perpendicular to amounting surface, but are not limited thereto. For example, the first and second internal electrodes 31 and 32 of the capacitor 110 may be stacked in a direction parallel to the mounting surface.

The magnetic layer 21 and the magnetic material 122 may be formed using a Ni—Cu—Zn based ferrite material, a Ni—Cu—Zn—Mg based ferrite material, or a Mn—Zn based ferrite material, but are not limited thereto.

According to an embodiment in the present disclosure, the inductor 120 may be a power inductor capable of being applied to the case of a large-capacity current.

The power inductor may refer to a high efficiency inductor in which a change in inductance is relatively small when a direct current (DC) is applied thereto, as compared to a general inductor. For example, the power inductor may have DC bias characteristics (a change in inductance depending on the application of a direct current) in addition to functions of a general inductor.

For example, the composite electronic component according to an embodiment in the present disclosure, used in a power management integrated circuit (PMIC), may include a power inductor other than a general inductor. The power inductor may be a high efficiency inductor in which a change in inductance is relatively small when a direct current is applied thereto.

Meanwhile, the ceramic body configuring the capacitor 110 may be formed by stacking a plurality of dielectric layers 11, and a plurality of internal electrodes 31 and 32, for example, a first internal electrode 31 and a second internal electrode 32, may be separately disposed in the ceramic body with each of the dielectric layers interposed therebetween.

The dielectric layer 11 may be formed by sintering a ceramic green sheet containing ceramic powder, an organic solvent, and an organic binder. As the ceramic powder, a high k material, a barium titanate ($BaTiO_3$) based material, a strontium titanate ($SrTiO_3$) based material, or the like, may be used, but the ceramic powder is not limited thereto.

Meanwhile, according to an embodiment in the present disclosure, the first internal electrode 31 may be exposed to the first end surface of the composite body 130, and the second internal electrode 32 may be exposed to the second end surface of the composite body 130, but the present disclosure is not necessarily limited thereto.

According to an embodiment in the present disclosure, the first and second internal electrodes 31 and 32 may be formed using a conductive paste containing a conductive metal.

The conductive metal may be nickel (Ni), copper (Cu), palladium (Pd), or an alloy thereof, but is not limited thereto.

The first and second internal electrodes 31 and 32 may be printed on the ceramic green sheet forming the dielectric layer 11 by a printing method such as a screen printing method or a gravure printing method using the conductive paste.

The ceramic green sheets having the internal electrode printed thereon may be alternately stacked and sintered, thereby forming the ceramic body.

Although pattern shapes of the first and second internal electrodes 31 and 32 are illustrated in FIG. 5, the present disclosure is not limited thereto, and the pattern shapes may be variously changed.

The capacitor may serve to adjust a voltage supplied from a power management integrated circuit (PMIC).

The composite electronic component 100 according to an embodiment in the present disclosure may include an input terminal 151 formed on the first end surface of the composite body 130 and connected to the coil part 140 of the inductor 120; an output terminal 152 including a first output terminal 152a formed on the second end surface of the composite body 130 and connected to the coil part 140 of the inductor 120 and a second output terminal 152b formed on the second end surface of the composite body 130 and connected to the first internal electrode 31 of the capacitor 110; and a ground terminal 153 formed on one or more of the upper and lower surfaces and the first end surface of the capacitor 110 in the composite body 130 and connected to the second internal electrode 32 of the capacitor 110.

The input terminal 151 and the first output terminal 152a may be connected to the coil part 140 of the inductor 120 to thereby serve as the inductor in the composite electronic component.

Further, the second output terminal 152b may be connected to the first internal electrode 31 of the capacitor 110, and the second internal electrode 32 of the capacitor 120 may be connected to the ground terminal 153, thereby serving as the capacitor in the composite electronic component.

The input terminal 151, the output terminal 152, and the ground terminal 153 may be formed using a conductive paste containing a conductive metal.

The conductive metal may be nickel (Ni), copper (Cu), tin (Sn), or an alloy thereof, but is not limited thereto.

The conductive paste may further contain an insulation material. The insulating material may be, for example, glass, but is not limited thereto.

A method of forming the input terminal 151, the output terminal 152, and the ground terminal 153 is not particularly limited. For example, the input terminal 151, the output terminal 152, and the ground terminal 153 may be formed by dipping the ceramic body or by a different method such as a printing method, a plating method, or the like.

Figure 6:
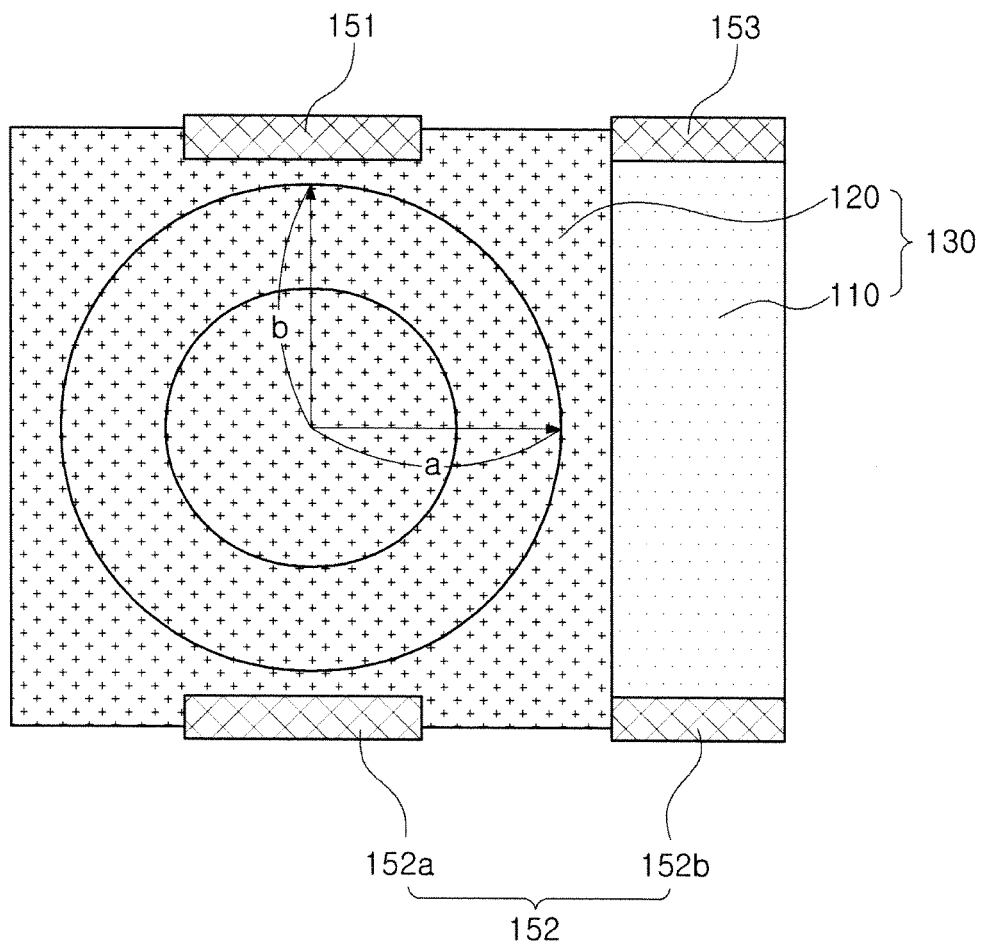
FIG. 6 is a top plan diagram of the composite electronic component shown in FIG. 1.

FIG. 6 is a top plan diagram of the composite electronic component shown in FIG. 1.

Referring to FIG. 6, in the composite electronic component according to an exemplary embodiment in the present disclosure, the sum of the ratio of lengths of a short axis to a long axis of the coil part 140 may be 0.7 to 1.0.

When a radius of the long axis of the coil part 140 is defined as a and a radius of the short axis is defined as b, the sum of the ratio of lengths b/a of the short axis to the long axis is adjusted so as to be 0.7 to 1.0, such that an effect of increasing inductance of the inductor and decreasing direct current resistance Rdc may be obtained.

In the case in which the sum of the ratio of lengths b/a of the short axis to the long axis of the coil part 140 is 0.7 to 1.0, a shape of the coil part 140 may be close to circular, rather than having a generally oval shape.

In the case in which the shape of the coil part 140 is close to the circular shape, since a length of an electrode may be decreased as compared to an area of an internal magnetic path, direct current resistance Rdc may be decreased.

In addition, actually, a volume occupied by a coil itself may be important consideration in the inductor, and reduction in the length of the electrode may indicate that the area occupied by the coil is decreased such that a magnetic flux passing area may be rather increased and inductance may thus be increased.

In the case in which the sum of the ratio of lengths of the short axis to the long axis of the coil part 140 is less than 0.7, since the shape of the coil part 140 may be an oval shape similarly to that of an inductor coil according to the related art, an effect of increasing inductance and decreasing direct current resistance Rdc may not be exhibited.

In the case in which the sum of the ratio of lengths of the short axis to the long axis of the coil part 140 is 1.0, the shape of the coil part 140 is a perfect circular shape, and the effect of increasing inductance and decreasing direct current resistance Rdc may be relatively most excellent, but it may be difficult to implement the perfect circular shape due to a process variation.

Meanwhile, as shown in FIG. 6, in the composite electronic component according to an exemplary embodiment in the present disclosure, the inductor 120 may have a shape close to a square shape.

Generally, in a composite electronic component in which an inductor and a capacitor are coupled, in the case in which the capacitor is coupled to a side surface of the inductor, the composite electronic component may be implemented in a form in which the capacitor is coupled to a side surface of the inductor in a width direction of the inductor.

However, according to an embodiment in the present disclosure, since the inductor 120 has a square shape in which a width and a length thereof are almost equal to each other, in the case in which the capacitor 110 is coupled to the side surface of the inductor 120, even in the case of the composite electronic component having the same size as that of a composite electronic component according to the related art, the capacitor 110 may be manufactured so that a length thereof is reduced and a width thereof is increased as compared to those in the case of the related art.

As described above, the capacitor 110 according to an embodiment in the present disclosure may be manufactured so that a length thereof is reduced and a width thereof is increased as compared to those according to the related art, unlike a general shape, capacitance of the capacitor may be increased, and a damage defect may be decreased.

In the case in which the capacitor 110 is manufactured so as to have a length reduced and a width increased as compared to those in general cases, since a volume that does not contribute to capacitance is decreased from 35.9% to 32.5% as compared to a general capacitor, such that capacitance may be increased by 3 to 4%.

Further, in the case in which the capacitor 110 is coupled to the side surface of the inductor 120, a distance between an external electrode of the inductor and an external electrode of the capacitor may be increased, such that a mounting defect may be decreased.

Figure 7:
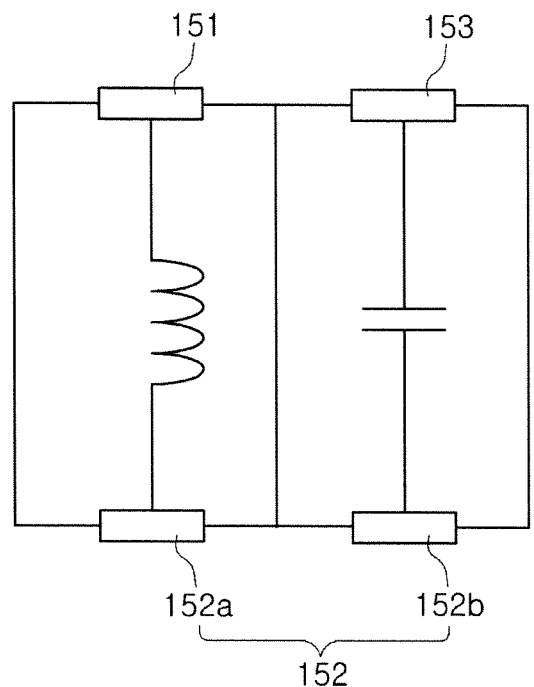
FIG. 7 is an equivalent circuit diagram of the composite electronic component shown in FIG. 1.

FIG. 7 is an equivalent circuit diagram of the composite electronic component shown in FIG. 1.

Referring to FIG. 7, in the composite electronic component according to an exemplary embodiment in the present disclosure, since the inductor 120 and the capacitor 110 are coupled to each other unlike the related art, the inductor 120 and the capacitor 110 may be designed so as to have a shortest distance therebetween, such that noise may be decreased.

In addition, since the inductor 120 and the capacitor 110 are coupled to each other, amounting area in the power management integrated circuit (PMIC) may be significantly decreased, such that the composite electronic component may be advantageous in terms of securing a mounting space.

Further, a mounting cost may be decreased.

Meanwhile, as an electronic device has various functions, the number of direct current (DC)/DC converters included in the PMIC has been increased, and the number of passive elements that should be included in a power input terminal and a power output terminal of the PMIC has also been increased.

In this case, since a component arrangement area of the electronic device is increased, there may be a limitation in miniaturizing the electronic device.

In addition, a high level of noise may occur by wiring patterns of the PMIC and peripheral circuits of the PMIC.

In order to solve the above-mentioned problems, research into a composite electronic component in which an inductor and a capacitor are vertically coupled to each other has been conducted, such that an effect of decreasing the component arrangement area and suppressing the occurrence of noise may be obtained.

However, in the case of vertically disposing the inductor and the capacitor as described above, a magnetic flux generated in the inductor affects internal electrodes of the capacitor to generate parasitic capacitance, such that a self resonant frequency (SRF) may move toward a low frequency.

In the case in which the self resonant frequency (SRF) moves toward a low frequency as described above, a usable frequency range of the inductor according to an embodiment in the present disclosure may be relatively narrow.

For example, since functions of the inductor are not implemented in a high frequency region of the self resonant frequency (SRF) or more, in the case in which the self resonant frequency (SRF) moves toward a low frequency, the usable frequency region may be limited.

However, according to an embodiment in the present disclosure, since the capacitor 110 may be coupled to the side surface of the inductor 120, an influence of a magnetic flux generated in the inductor on the internal electrode of the capacitor may be significantly decreased, such that a change in the self resonant frequency (SRF) may be prevented.

For example, according to an embodiment in the present disclosure, since the inductor 120 and the capacitor 110 may be designed so as to have a shortest distance therebetween, noise may be decreased, and the change in the self resonant frequency may be prevented, such that a range of the inductor usable at a low frequency may not be limited.

Meanwhile, as the composite electronic component has been miniaturized and accordingly, an internal magnetic layer blocking a magnetic field of the inductor has also been reduced, there may be a problem in which Q factor may be decreased.

The Q factor refers to a loss of an element or deterioration of efficiency, and the higher the Q factor is, the smaller the loss is and the higher the efficiency is.

For example, according to an embodiment in the present disclosure, the capacitor 110 is coupled to the side surface of the inductor 120, such that influences of the components on each other may be significantly decreased, thereby preventing a Q factor from being decreased.

A detailed description related to the self resonant frequency (SRF) and the Q factor will be described below.

Figure 8:
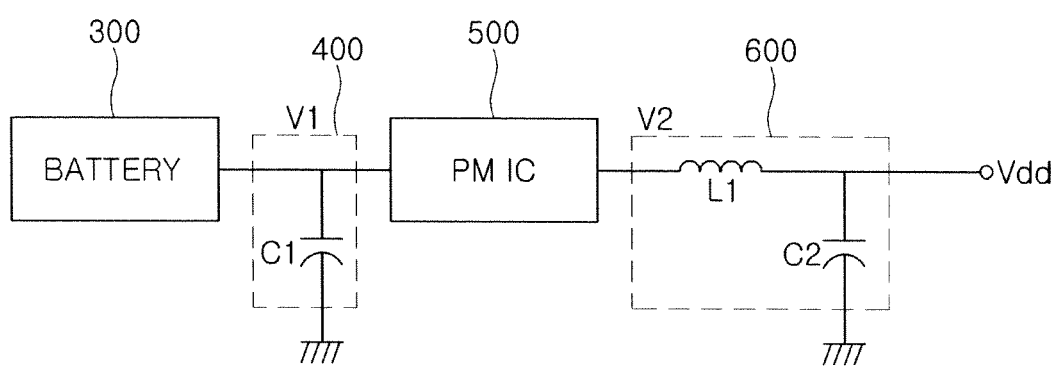
FIG. 8 is a diagram illustrating a driving power supply system supplying driving power to a predetermined terminal requiring driving power through a battery and a power management unit.

FIG. 8 is a diagram illustrating a driving power supply system supplying driving power to a predetermined terminal requiring driving power through a battery and a power management unit.

Referring to FIG. 8, the driving power supply system may include a battery 300, a first power stabilization unit 400, a power management unit 500, and a second power stabilization unit 600.

The battery 300 may supply power to the power management unit 500. Here, power supplied to the power management unit 500 by the battery 300 will be defined as first power.

The first power stabilization unit 400 may stabilize the first power $V_1$ and supply the stabilized first power to the power management unit 500. In further detail, the first power stabilization unit 400 may include a capacitor $C_1$ disposed between a connection terminal of the battery 300 and the power management unit 500 and a ground. The capacitor $C_1$ may decrease noise included in the first power.

In addition, the capacitor $C_1$ may charge electric charges. Further, in the case in which the power management unit 500 instantly consumes a large current, the capacitor $C_1$ may discharge the charged electric charges to suppress a voltage of the power management unit 500 from being changed.

The capacitor $C_1$ may be a high capacitance capacitor in which 300 or more dielectric layers are stacked.

The power management unit 500 may serve to convert power supplied to an electronic device so as to be suitable for the electronic device and distribute, charge, and control the power. Therefore, the power management unit 500 may generally include a DC/DC converter.

In addition, the power management unit 500 may be implemented as a power management integrated circuit (PMIC).

The power management unit 500 may convert the first power $V_1$ into second power $V_2$. The second power $V_2$ may be power required in an active element such as an integrated circuit (IC), or the like, connected to an output terminal of the power management unit 500.

The second power stabilization unit 600 may stabilize the second power $V_2$ and supply the stabilized second power to an output terminal $V_{dd}$. The active element such as the IC, or the like, supplied with the driving power from the power management unit 500 may be connected to the output terminal $V_{dd}$.

More specifically, the second power stabilization unit 600 may include an inductor $L_1$ connected in series between the power management unit 500 and the output terminal $V_{dd}$. In addition, the second power stabilization unit 600 may include a capacitor $C_2$ formed between a connection terminal of the power management unit 500 and the output terminal $V_{dd}$ and the ground.

The second power stabilization unit 600 may decrease noise included in the second power $V_2$.

Further, the second power stabilization unit 600 may stably supply power to the output terminal $V_{dd}$.

The inductor $L_1$ may be a power inductor capable of being applied to large-capacity current.

The power inductor may mean a high efficiency inductor of which a change in inductance is small when a direct current is applied thereto, as compared to a general inductor. For example, it may be considered that the power inductor has DC bias characteristics (a change in inductance depending on application of a direct current) in addition to functions of a general inductor.

In addition, the capacitor $C_2$ may be a high capacitance capacitor.

Figure 9:
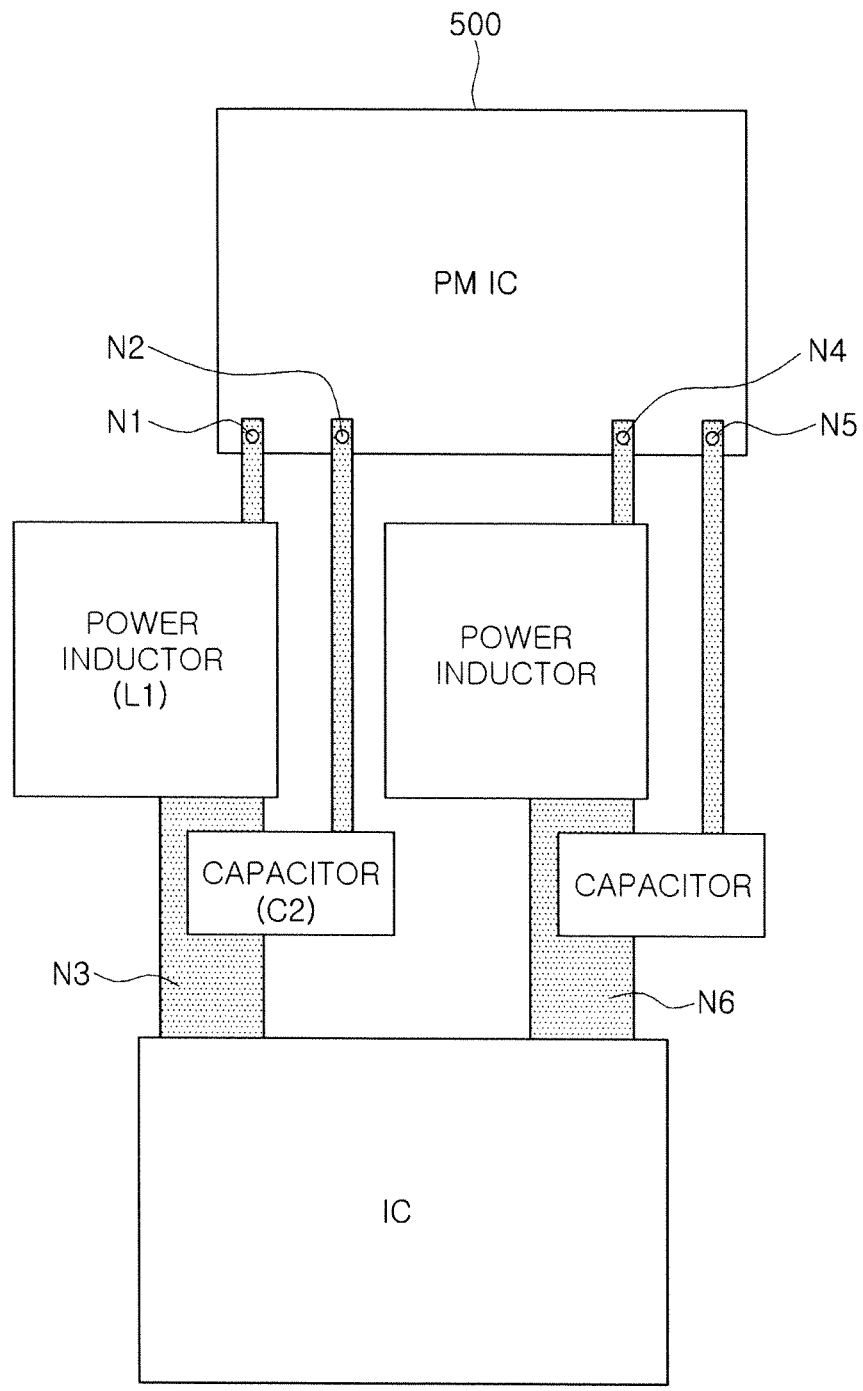
FIG. 9 is a diagram illustrating a layout pattern of the driving power supply system.

FIG. 9 is a diagram illustrating a layout pattern of the driving power supply system.

Referring to FIG. 9, a layout pattern of the power management unit 500, the power inductor $L_1$, and the second capacitor $C_2$ may be confirmed.

Generally, the power management unit 500 (PMIC) may include several to several ten DC/DC converters. Further, in order to implement a function of the DC/DC converter, a power inductor and a high capacitance capacitor may be required in each of the DC/DC converters.

Referring to FIG. 9, the power management unit 500 may include predetermined terminals N1 and N2. The power management unit 500 may be supplied with power from the battery and convert the power using the DC/DC converter. In addition, the power management unit 500 may supply the converted power through the first terminal N1. The second terminal N2 may be the ground terminal.

Here, since the first power inductor $L_1$ and the second capacitor $C_2$ may be supplied with power from the first terminal N1 and stabilize the supplied power to supply driving power through a third terminal N3, the first power inductor $L_1$ and the second capacitor $C_2$ may perform functions of the second power stabilization unit.

Since fourth to sixth terminals N4 to N6 shown in FIG. 9 perform the same functions as those of the first to third terminals N1 to N3, a detailed description thereof will be omitted.

In a pattern design of the driving power supply system, the important consideration is that the power management unit, the power inductor, and the high capacitance capacitor need to be disposed so as to be as close as possible to each other. In addition, wiring of a power line needs to be shortly and thickly designed.

The reason is that only in the case in which the above-mentioned conditions are satisfied, a component arrangement area may be decreased, and the occurrence of noise may be suppressed.

In the case in which the number of output terminals of the power management unit 500 is relatively small, a problem in terms of disposing the power inductor and the high capacitance capacitor so as to be close to each other may not be present. However, in the case of using various output terminals in the power management unit 500, the power inductor and the high capacitance capacitor may not be normally arranged due to a component density. In addition, an event in which the power inductor and the high capacitance capacitor are required to be arranged in a non-optimal state according to the priority of power may occur.

For example, since sizes of the power inductor and the high capacitance capacitor are relatively large, at the time of actually arranging the elements, a power line and a signal line may inevitably be elongated.

In the case in which the power inductor and the high capacitance capacitor are arranged in the non-optimal state, an interval between elements may be great and power lines may be relatively long, thereby causing the occurrence of noise. Such noise may have a negative influence on the power supply system.

Figure 10:
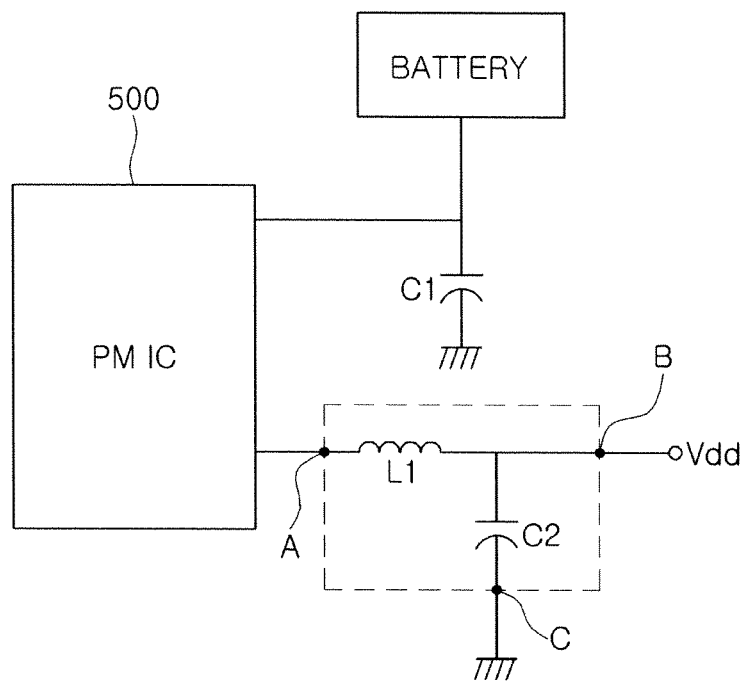
FIG. 10 is a circuit diagram of the composite electronic component according to an embodiment in the present disclosure.

FIG. 10 is a circuit diagram of the composite electronic component according to an embodiment in the present disclosure.

Referring to FIG. 10, a composite electronic component 700 may include an input terminal unit A (an input terminal), a power stabilization unit, an output terminal unit B (an output terminal), and a ground terminal unit C (a ground terminal).

The power stabilization unit may include a power inductor $L_1$ and a second capacitor $C_2$.

The composite electronic component 700 is an element capable of performing the function of the second power stabilization unit as described above.

The input terminal unit A may receive power converted by the power management unit 500.

The power stabilization unit may stabilize power supplied from the input terminal unit A.

The output terminal unit B may supply the stabilized power to the output terminal $V_{dd}$.

The ground terminal unit C may connect the power stabilization unit to the ground.

On the other hand, the power stabilization unit may include the power inductor $L_1$ connected between the input terminal unit A and the output terminal unit B and the second capacitor $C_2$ connected between the ground terminal unit C and the output terminal unit.

Referring to FIG. 10, the power inductor $L_1$ and the second capacitor $C_2$ share the output terminal unit B with each other, such that an interval between the power inductor $L_1$ and the second capacitor $C_2$ may be decreased.

As described above, in the composite electronic component 700, the power inductor and the high capacitance capacitor provided in an output power terminal of the power management unit 500 are implemented as a single component. Therefore, in the case of the composite electronic component 700, a degree of integration of the element may be improved.

Figure 11:
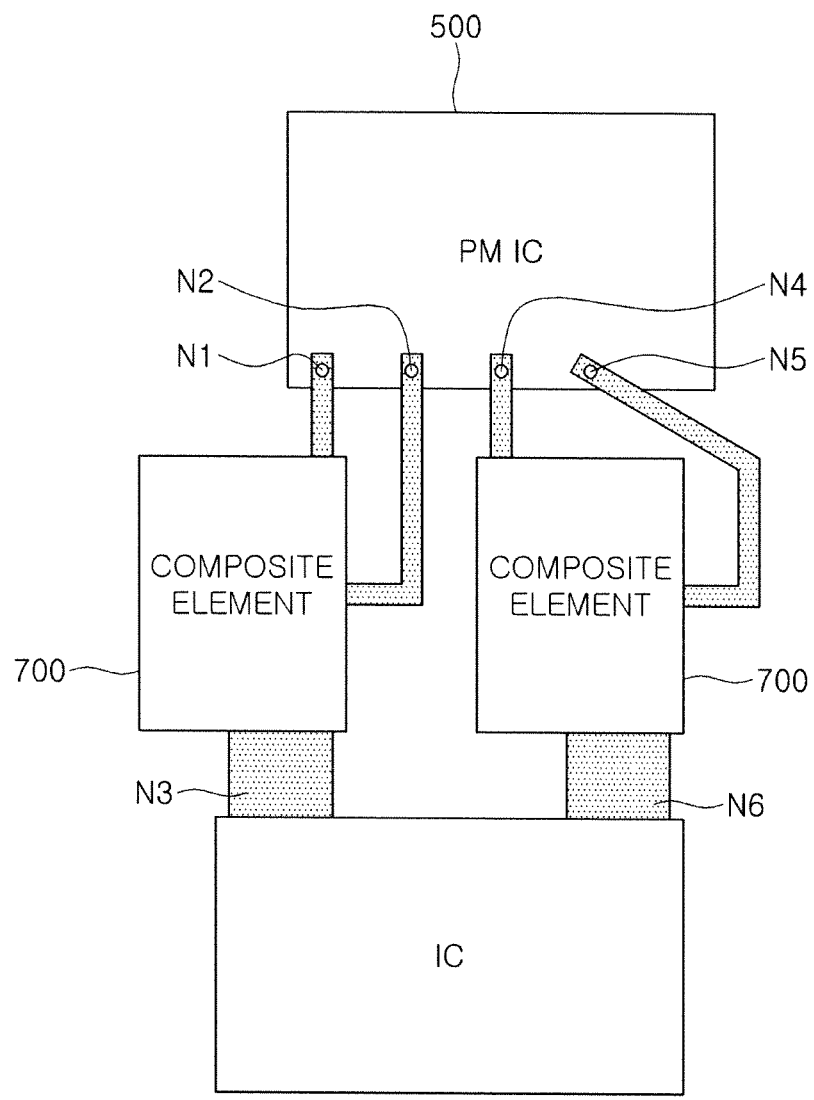
FIG. 11 is a diagram illustrating a layout pattern of a driving power supply system to which the composite electronic component according to an embodiment in the present disclosure is applied.

FIG. 11 is a diagram illustrating a layout pattern of a driving power supply system to which the composite electronic component according to an embodiment in the present disclosure is applied.

Referring to FIG. 11, it may be appreciated that the second capacitor $C_2$ and the power inductor $L_1$ shown in FIG. 9 are replaced with a composite electronic component according to an embodiment in the present disclosure.

As described above, the composite electronic component may serve the function of the second power stabilization unit.

In addition, a length of wiring may be significantly decreased by replacing the second capacitor $C_2$ and the power inductor $L_1$ with the composite electronic component according to an embodiment in the present disclosure. Further, the number of arranged elements is decreased, such that the elements may be appropriately arranged.

For example, according to an embodiment in the present disclosure, the power management unit, the power inductor, and the high capacitance capacitor may be disposed so as to be as close as possible to each other, and the wiring of the power line may be designed to be relatively short and thick, such that noise may be decreased.

Meanwhile, in order to satisfy customer needs, electronic device manufacturers have made an effort to decrease a size of a printed circuit board (PCB) included in the electronic device. Therefore, it is required to increase a degree of integration of an integrated circuit (IC) mounted in the PCB. This demand may be satisfied by configuring a plurality of elements as a single composite component, similarly to the composite electronic component according to an embodiment in the present disclosure.

In addition, according to an embodiment in the present disclosure, two components (the second capacitor and the power inductor) are implemented as the single composite electronic component, such that amounting area in the PCB may be decreased. According to the present embodiment, the mounting area may be decreased by about 10 to 30% as compared to an existing layout pattern.

Further, according to an embodiment in the present disclosure, the power management unit 500 may supply power to an IC supplied with driving power, through a relatively shortest wiring.

In addition, in the composite electronic component according to an exemplary embodiment in the present disclosure, since the capacitor is disposed on the side surface of the inductor, the influence of a magnetic flux generated in the inductor on the internal electrode of the capacitor may be significantly decreased, such that a change in the self resonant frequency (SRF) may be prevented.

Further, in the composite electronic component according to an exemplary embodiment in the present disclosure, the capacitor may be disposed on the side surface of the inductor, thereby preventing a Q factor of the component from being decreased.

The following Table 1 shows comparison results of inductance Ls and direct current resistance Rdc according to a ratio of a short axis to a long axis of a coil part.

Composite electronic components of embodiments in the present disclosure and Comparative Examples were manufactured while changing a ratio of a length of the short axis to that of the long axis of the coil part in a state in which an area of an inductor was fixed.

In embodiments in the present disclosure and Comparative Examples, measurement was performed based on a 2012 size (length×width×thickness is 2.0 mm×1.2 mm×1.2 mm) and a 7.5-turn coil, and other factors such as a cross-sectional shape of a conductor, a thickness of a chip, and the like were equally applied to embodiments in the present disclosure and Comparative Examples.

TABLE 1

|   | Long Axis [μm] | Short Axis [μm] | Short Axis/Long Axis | Ls [μH] | Rdc [mΩ] |
|---|---|---|---|---|---|
| *1 | 2.20 | 1.09 | 0.50 | 0.809 | 58.1 |
| *2 | 2.00 | 1.20 | 0.60 | 0.889 | 54.1 |
| *3 | 1.90 | 1.26 | 0.66 | 0.913 | 52.2 |
| 4 | 1.80 | 1.33 | 0.74 | 0.928 | 50.5 |
| 5 | 1.70 | 1.41 | 0.83 | 0.932 | 48.9 |
| 6 | 1.60 | 1.50 | 0.94 | 0.922 | 47.5 |
| 7 | 1.55 | 1.55 | 1.00 | 0.910 | 46.8 |

*Comparative Example

Referring to Table 1, it may be appreciated that in samples 4 to 7 of embodiments in the present disclosure, inductance is increased, and direct current resistance Rdc is also decreased.

Board for Mounting of Multilayer Ceramic Capacitor

Figure 12:
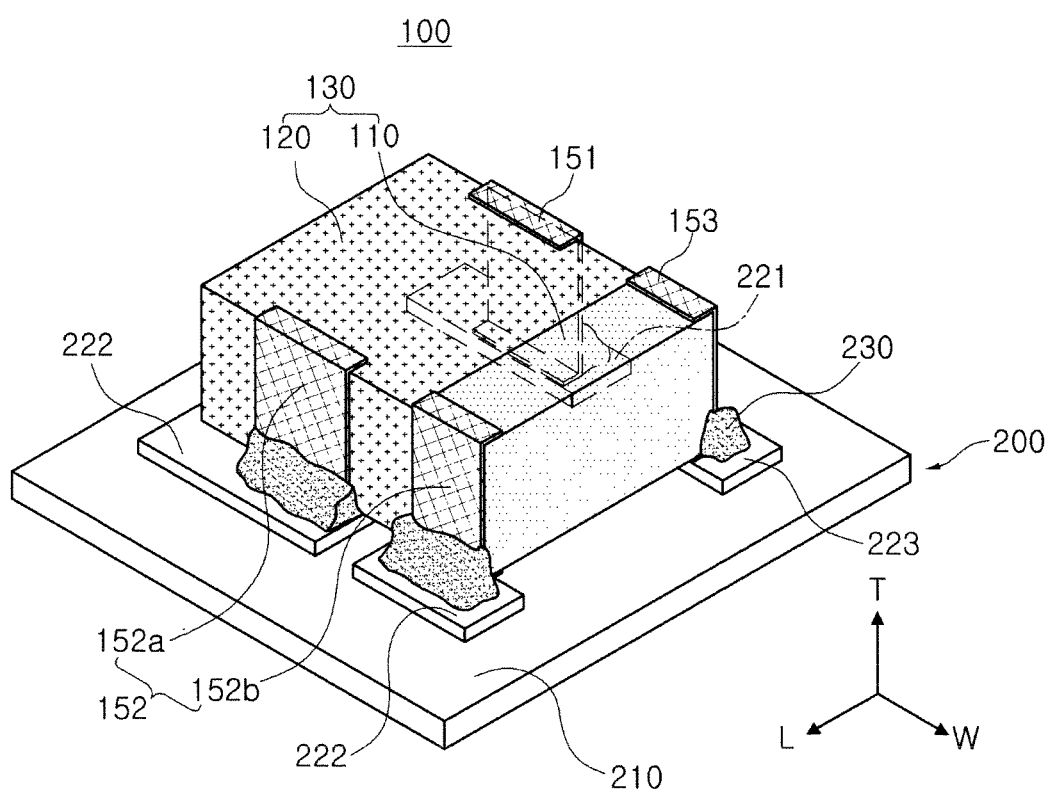
FIG. 12 is a perspective diagram illustrating a form in which the composite electronic component of FIG. 1 is mounted on a printed circuit board.

FIG. 12 is a perspective diagram illustrating a form in which the composite electronic component of FIG. 1 is mounted on a printed circuit board.

Referring to FIG. 12, a board 200 for mounting of the composite electronic component 100 according to an embodiment in the present disclosure may include a printed circuit board 210 on which the composite electronic component 100 is mounted, and three or more electrode pads 221 to 223 formed on the printed circuit board 210.

The electrode pad may be configured of first to third electrode pads 221 to 223 connected to the input terminal 151, the output terminal 152, and the ground terminal 153 of the composite electronic component, respectively.

In this case, the composite electronic component 100 may be electrically connected to the printed circuit board 210 by soldering 230 in a state in which the input terminal 151, the output terminal 152, and the ground terminal 153 of the composite electronic component 100 are positioned on the first to third electrode pads 221 to 223 so as to contact each other.

Further, the composite electronic component mounted on the printed circuit board may be a composite electronic component according to another exemplary embodiment in the present disclosure, and in order to avoid an overlapping description, a description thereof will be omitted.

Figure 13:
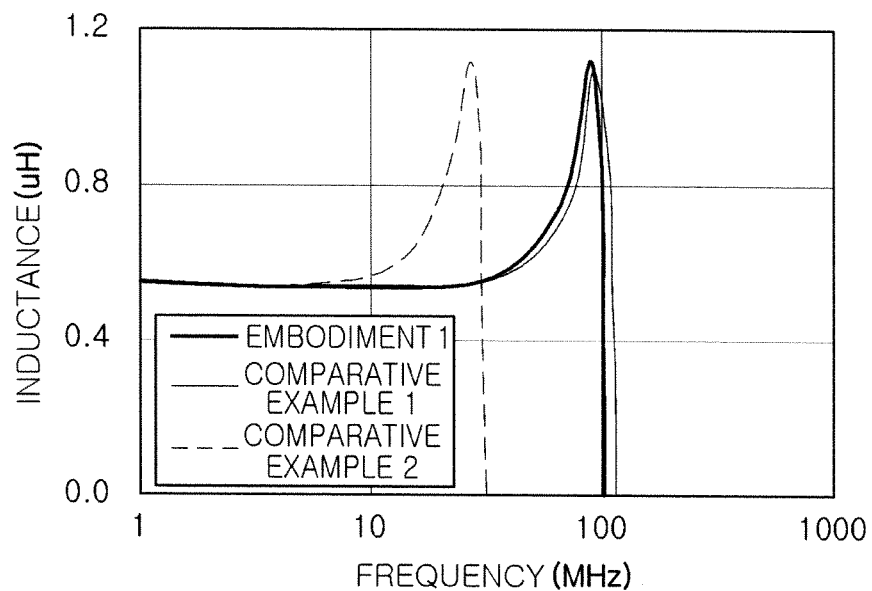
FIG. 13 is a graph illustrating a change in a self resonant frequency (SRF) according to embodiments in the present disclosure and Comparative Examples.

FIG. 13 is a graph illustrating a change in a self resonant frequency (SRF) according to Embodiments in the present disclosure and Comparative Examples.

Referring to FIG. 13, Embodiment 1 indicates the case of using a composite electronic component in which a capacitor is coupled to aside surface of an inductor according to an embodiment in the present disclosure, Comparative Example 1 indicates the case of using a power inductor alone, and Comparative Example 2 indicates the case in which a capacitor and an inductor are vertically coupled to each other.

Referring to the graph, it may be appreciated that in Embodiment 1 in which the capacitor is coupled to the side surface of the inductor, a self resonant frequency (SRF) is almost equal to that in Comparative Example 1 in which the power inductor is used alone.

Meanwhile, it may be appreciated that in Comparative Example 2 in which the inductor and the capacitor are vertically coupled to each other, a self resonant frequency (SRF) is moved toward a low frequency region, such that a use range of the inductor is limited.

Figure 14:
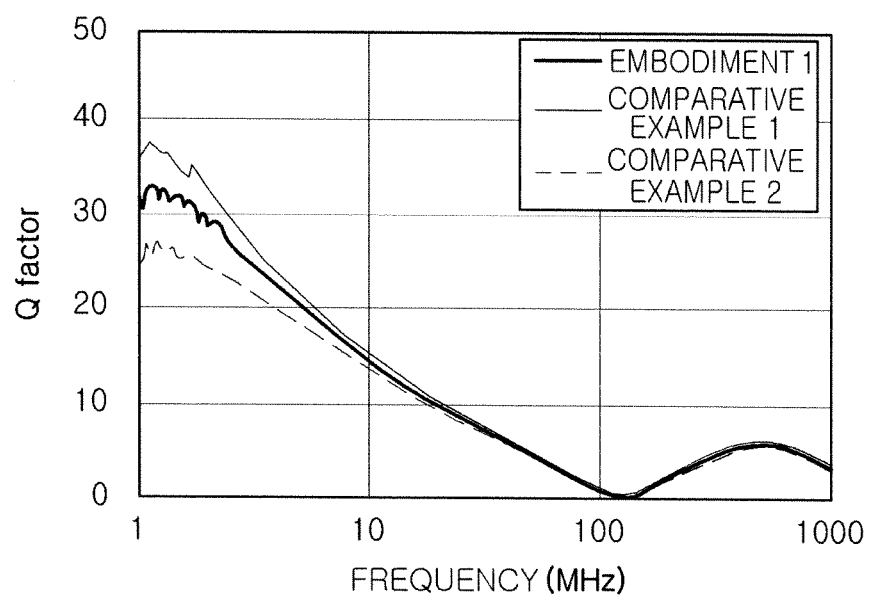
FIG. 14 is a graph illustrating a change in Q factor according to embodiments in the present disclosure and Comparative Examples.

FIG. 14 is a graph illustrating a change in Q factor according to embodiments in the present disclosure and Comparative Examples.

Referring to FIG. 14, Embodiment 1 indicates the case of using a composite electronic component in which a capacitor is coupled to a side surface of an inductor according to an embodiment in the present disclosure, Comparative Example 1 indicates the case of using a power inductor alone, and Comparative Example 2 indicates the case in which a capacitor and an inductor are vertically coupled to each other.

Referring to the graph, it may be appreciated that in Embodiment 1 in which the capacitor is coupled to the side surface of the inductor, a Q factor is close to that in Comparative Example 1 in which the power inductor is used alone.

Meanwhile, it may be appreciated that in Comparative Example 2 in which the inductor and the capacitor are vertically coupled to each other, a Q factor is decreased as compared to that of Embodiments 1 indicating the case of using the composite electronic component in which the capacitor is coupled to the side surface of the inductor and Comparative Example 1 indicating the case of using the power inductor alone.

As set forth above, according to embodiments in the present disclosure, the composite electronic component capable of decreasing a component mounting area in a driving power supply system may be provided.

In addition, according to embodiments in the present disclosure, the composite electronic component capable of decreasing the occurrence of noise in the driving power supply system may be provided.

Further, in the composite electronic component according to an embodiment in the present disclosure, the effect of increasing inductance of the inductor and decreasing direct current resistance Rdc may be obtained by adjusting a ratio of the short axis to the long axis of the coil part.

In addition, in the composite electronic component according to an embodiment in the present disclosure, since the capacitor is coupled to the side surface of the inductor, the influence of the magnetic flux generated in the inductor on the internal electrode of the capacitor may be significantly decreased, such that a change in the self resonant frequency (SRF) may be prevented.

Furthermore, in the composite electronic component according to an embodiment in the present disclosure, the capacitor may be disposed on the side surface of the inductor, thereby preventing a Q factor of a component from being decreased.

While exemplary embodiments have been shown and described above, it will be apparent to those skilled in the art that modifications and variations could be made without departing from the scope in the present disclosure as defined by the appended claims.

What is claimed is:

1. A composite electronic component comprising:
a composite body including a capacitor and an inductor coupled to each other, the capacitor being configured of a ceramic body including a plurality of dielectric layers and first and second internal electrodes disposed to face each other with a respective dielectric layer interposed between the first and second internal electrodes are stacked, and the inductor being configured of a magnetic body including a coil part;
an input terminal formed on a first end surface of the composite body and connected to the coil part of the inductor;
an output terminal including a first output terminal formed on a second end surface of the composite body and connected to the coil part of the inductor and a second output terminal formed on the second end surface of the composite body and connected to the first internal electrode of the capacitor; and
a ground terminal formed on one or more of upper and lower surfaces and a first end surface of the capacitor in the composite body and connected to the second internal electrode of the capacitor,
wherein the capacitor is coupled to a side surface of the inductor, and the sum of ratio of lengths of a short axis to a long axis of the coil part is more than 0.7 and less than 1.0, and
a direction of a magnetic flux of the inductor is parallel to surfaces of the first and second internal electrodes disposed in the capacitor.

2. The composite electronic component of claim 1, wherein the magnetic body has a form in which a plurality of magnetic layers including a conductive pattern formed on the magnetic layers are stacked, the conductive pattern configuring the coil part.

3. The composite electronic component of claim 1, wherein the inductor has a form of a thin film in which the magnetic body includes an insulation substrate and a coil formed on at least one surface of the insulation substrate.

4. The composite electronic component of claim 1, wherein the magnetic body has a form including a core and a winding coil wound around the core.

5. The composite electronic component of claim 1, wherein the inductor is a power inductor.

6. The composite electronic component of claim 1, wherein the capacitor and the inductor are connected to each other by a conductive adhesive.

7. A board for mounting of a composite electronic component comprising:
a printed circuit board having three or more electrode pads formed on the printed circuit board;
the composite electronic component of claim 1, mounted on the printed circuit board; and
a soldering connecting the electrode pads and the composite electronic component.

8. A composite electronic component comprising:
an input terminal receiving power converted by a power management unit;
a power stabilization unit stabilizing the power and including a composite body including a capacitor and an inductor coupled to each other, the capacitor being configured of a ceramic body in which a plurality of dielectric layers and first and second internal electrodes disposed so as to face each other with a respective dielectric layer interposed between the first and second internal electrodes are stacked, the inductor being configured of a magnetic body including a coil part, the capacitor being coupled to a side surface of the inductor, the sum of ratio of lengths of a short axis to a long axis of the coil part being more than 0.7 and less than 1.0, and a direction of a magnetic flux of the inductor being parallel to surfaces of the first and second internal electrodes disposed in the capacitor;
an output terminal supplying the stabilized power; and
a ground terminal for grounding.

9. The composite electronic component of claim 8, wherein the input terminal is formed on a first end surface of the composite body,
the output terminal includes a first output terminal formed on a second end surface of the composite body and connected to the coil part of the inductor and a second output terminal formed on the second end surface of the composite body and connected to the first internal electrode of the capacitor; and
the ground terminal is formed on one or more of upper and lower surfaces and a first end surface of the capacitor in the composite body and connected to the second internal electrode of the capacitor.

10. The composite electronic component of claim 8, wherein the magnetic body has a form in which a plurality of magnetic layers including a conductive pattern formed on the magnetic layers are stacked, the conductive pattern configuring the coil part.

11. The composite electronic component of claim 8, wherein the inductor has a form of a thin film in which the magnetic body includes an insulation substrate and a coil formed on at least one surface of the insulation substrate.

12. The composite electronic component of claim 8, wherein the magnetic body has a form including a core and a winding coil wound around the core.

13. The composite electronic component of claim 8, wherein the inductor is a power inductor.

14. The composite electronic component of claim 8, wherein the capacitor and the inductor are connected to each other by a conductive adhesive.

15. A board for mounting of a composite electronic component comprising:
- a printed circuit board having three or more electrode pads formed on the printed circuit board;
- the composite electronic component of claim 8, mounted on the printed circuit board; and
- a soldering connecting the electrode pads and the composite electronic component.

* * * * *